(12) United States Patent
Shimamoto

(10) Patent No.: US 12,160,207 B2
(45) Date of Patent: Dec. 3, 2024

(54) POWER AMPLIFIER, POWER AMPLIFIER CIRCUIT, AND POWER AMPLIFIER DEVICE

(71) Applicant: Murata Manufacturing Co., Ltd., Kyoto (JP)

(72) Inventor: Kenichi Shimamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 683 days.

(21) Appl. No.: 17/235,387

(22) Filed: Apr. 20, 2021

(65) Prior Publication Data

US 2021/0328561 A1 Oct. 21, 2021

(30) Foreign Application Priority Data

Apr. 21, 2020 (JP) .................. 2020-075387

(51) Int. Cl.
| | |
|---|---|
| *H03F 3/21* | (2006.01) |
| *H01L 23/66* | (2006.01) |
| *H03F 1/02* | (2006.01) |
| *H03F 1/56* | (2006.01) |

(52) U.S. Cl.
CPC .............. *H03F 3/211* (2013.01); *H01L 23/66* (2013.01); *H03F 1/0211* (2013.01); *H01L 2223/6655* (2013.01); *H03F 1/56* (2013.01); *H03F 2200/222* (2013.01); *H03F 2200/451* (2013.01)

(58) Field of Classification Search
CPC ......... H03F 3/211; H03F 1/0211; H03F 1/56; H03F 2200/222; H03F 2200/451; H03F 3/195; H03F 1/30; H03F 3/20; H01L 23/66; H01L 2223/6655; H01L 2224/16225; H01L 23/642; H01L 24/10; H01L 2924/181
USPC ....................................... 330/296
See application file for complete search history.

(56) References Cited

U.S. PATENT DOCUMENTS

| | | | |
|---|---|---|---|
| 6,344,775 B1 | 2/2002 | Morizuka et al. | |
| 7,227,418 B2 | 6/2007 | Makioka | |
| 9,035,701 B2 | 5/2015 | Schooley et al. | |
| 9,490,753 B1 * | 11/2016 | Kryshtopin | ............... H03F 1/30 |
| 9,806,674 B2 | 10/2017 | Sasaki | |
| 2016/0315060 A1 | 10/2016 | Umemoto et al. | |
| 2019/0172773 A1 * | 6/2019 | Kurokawa | ............ H01L 23/296 |
| 2020/0106389 A1 * | 4/2020 | Yamada | ............... H03G 3/3042 |
| 2020/0336115 A1 * | 10/2020 | Choi | ......................... H03F 1/30 |

FOREIGN PATENT DOCUMENTS

| | | |
|---|---|---|
| JP | 2006-270526 A | 10/2006 |
| JP | 5967317 B2 | 8/2016 |

\* cited by examiner

*Primary Examiner* — Andrea Lindgren Baltzell
*Assistant Examiner* — Jose E Pinero
(74) *Attorney, Agent, or Firm* — Pearne & Gordon LLP

(57) ABSTRACT

A power amplifier includes a first transistor, a second transistor, and a third transistor that are formed on a semiconductor substrate, and a bump that is electrically connected to an emitter of the first transistor and that is provided so as to, when the semiconductor substrate is viewed in plan, overlay a first disposition region where the first transistor is disposed, a second disposition region where the second transistor is disposed, and a third disposition region where the third transistor is disposed.

20 Claims, 11 Drawing Sheets

POWER AMPLIFIER, POWER AMPLIFIER CIRCUIT, AND POWER AMPLIFIER DEVICE

CROSS REFERENCE TO RELATED APPLICATIONS

This application claims priority from Japanese Patent Application No. 2020-075387 filed on Apr. 21, 2020. The content of this application is incorporated herein by reference in its entirety.

BACKGROUND OF THE DISCLOSURE

Field of the Disclosure

The present disclosure relates to a power amplifier, a power amplifier circuit, and a power amplifier device.

Description of the Related Art

In amplifying radio frequency (RF) signals in mobile communications, a power amplifier device is used. The power amplifier device is constructed by mounting, on a module substrate, a semiconductor chip in which a power amplifier circuit including a power amplifier is provided on a semiconductor substrate. When the power amplifier circuit is flip-chip mounted on the module substrate, stress is applied to a transistor. With respect to the stress applied to a transistor, Japanese Patent No. 5967317 discloses a semiconductor device that relieves, during the operation of the transistor, the thermal stress caused by a difference between a thermal expansion coefficient of an emitter layer and a thermal expansion coefficient of a pillar bump.

For example, when heat is applied to the power amplifier circuit through a reflow test, the thermal stress caused by a difference between the thermal expansion coefficients is generated. Even after the heat is removed, the stress caused by the thermal stress remains in the power amplifier circuit. When the stress caused by the thermal stress is applied to the transistor of the power amplifier of the power amplifier circuit, the characteristics of the transistor vary. Due to the variations in the characteristics of the transistor, an idle current which is a current that flows to the transistor when no signals are present varies.

BRIEF SUMMARY OF THE DISCLOSURE

The present disclosure has been made in consideration of such circumstances and provides a power amplifier that reduces variations in idle current.

A power amplifier according to one aspect of the present disclosure includes a first transistor that is formed on a semiconductor substrate; a second transistor that is formed on the semiconductor substrate, that includes a base to which a first current which is part of a control current is supplied, and that is configured to supply a second current which is part of a bias current based on the first current to the first transistor; a third transistor that is formed on the semiconductor substrate, to which a third current which is part of the control current and a fourth current which is part of the bias current are supplied, and in which the third current decreases as applied stress increases; and a metal member that is electrically connected to an emitter of the first transistor and that is provided so as to, when the semiconductor substrate is viewed in plan, overlay a first disposition region where the first transistor is disposed, a second disposition region where the second transistor is disposed, and a third disposition region where the third transistor is disposed.

The present disclosure can provide the power amplifier that reduces variations in idle current.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
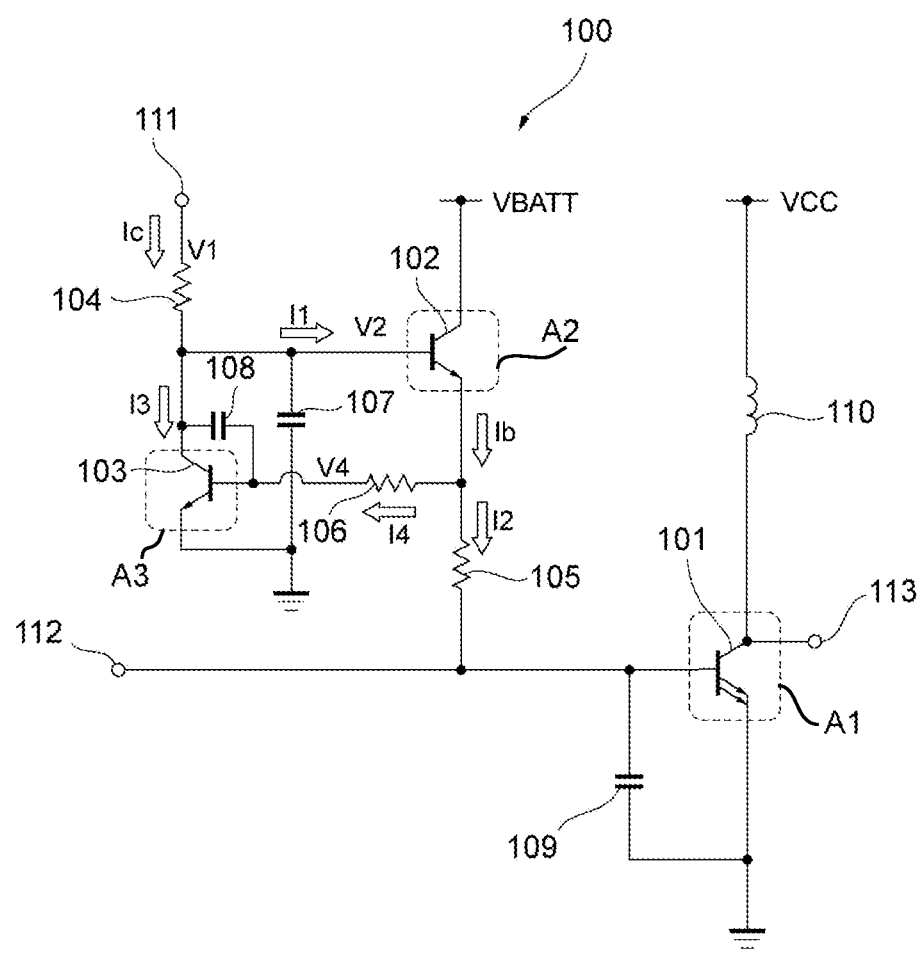
FIG. 1 is a circuit diagram of a power amplifier according to a present embodiment.

A power amplifier 100 according to a present embodiment will be described with reference to FIG. 1. The power amplifier 100 includes transistors 101, 102, and 103, resistance elements 104, 105, and 106, capacitors 107, 108, and 109, an inductor 110, input terminals 111 and 112, and an output terminal 113.

The transistor 101 (first transistor) is configured to function as a single transistor including a plurality of unit transistors (fingers) connected and arranged in parallel. In the following description, a base, an emitter, and a collector of the transistor 101 respectively refer to a base, an emitter, and a collector of each unit transistor.

The unit transistor of the transistor 101, and the transistors 102 and 103 are, for example, a transistor, such as a heterojunction bipolar transistor (HBT).

Figure 3:
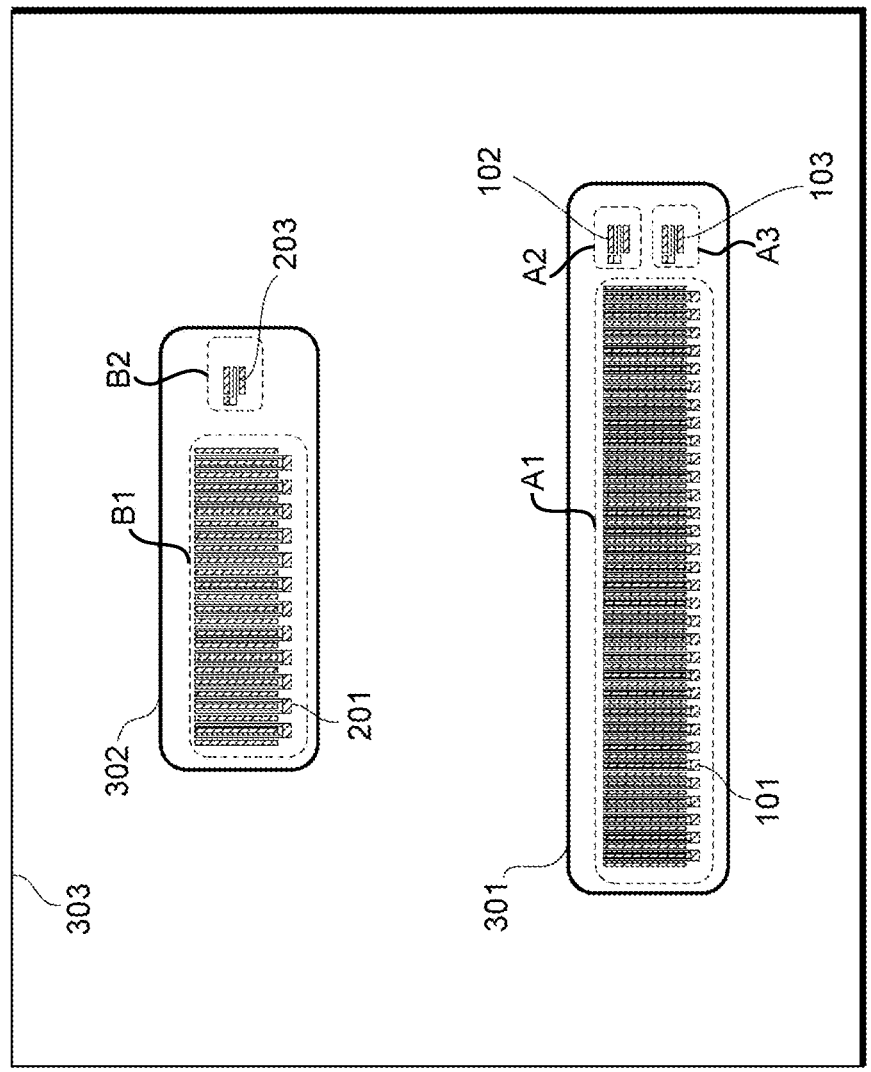
FIG. 3 is a schematic layout diagram of the power amplifier circuit according to the present embodiment.

The transistor 101 is provided in a disposition region A1 on a semiconductor substrate (illustrated in FIG. 3). In the transistor 101, the base is connected to an emitter of the transistor 102 through the resistance element 105, a power-supply voltage VCC is supplied to the collector through the inductor 110, and the emitter is connected to a ground. The base of the transistor 101 is connected to the ground through the capacitor 109. The transistor 101 amplifies a signal inputted through the input terminal 112 and outputs the signal from the output terminal 113. The capacitor 109 is connected to keep the voltage and current amplitudes of a radio-frequency wave from overlapping with each other at a time axis.

In the transistor 102 (second transistor), a base is connected to the resistance element 104, a collector is connected to a power supply, and the emitter is connected to the resistance element 105 and the resistance element 106. The base of the transistor 102 is connected to the ground through the capacitor 107. A voltage VBATT is supplied to the collector of the transistor 102. The transistor 102 is provided in a disposition region A2 on the semiconductor substrate (shown in FIG. 3). In FIG. 1, although the transistor 102 is illustrated as a single transistor, the transistor 102 may be a multi-finger transistor including a plurality of unit transistors.

In the transistor 102, a current I1 (first current) is supplied to the base in accordance with a current Ic (control current) inputted from the input terminal 111. The transistor 102 is switched between on and off states by the current I1. When the transistor 102 is in the on state, the transistor 102 outputs a current Ib (bias current) from the emitter in accordance with the current I1. A current I2 (second current) which is part of the current Ib is supplied to the base of the transistor 101.

In the transistor 103 (third transistor), a base is connected to the resistance element 106, a collector is connected to the resistance element 104, and an emitter is connected to the ground. The collector of the transistor 103 is connected to the base of the transistor 103 through the capacitor 108. The capacitor 108 functions as Miller capacitance.

A current I3 (third current) which is part of the current Ic is supplied to the collector of the transistor 103. A current I4 (fourth current) which is part of the current Ib is supplied to the base of the transistor 103 through the resistance element 106. The transistor 103 is an element in which the current I3 decreases as the stress applied to the transistor 103 increases.

The resistance elements 104, 105, and 106 are provided to produce the intended voltage drops caused by the respective currents Ic, I2, and 14 flowing therethrough. The capacitor 107 functions to cause an alternating-current component of the current Ic to flow to the ground. The capacitor 108 and the resistance element 106 constitute an RC series resonant circuit, and the RC series circuit is a filter that adjusts a frequency band such that an alternating-current signal having a frequency not less than a certain frequency returns to the base of the transistor 102.

If a bias circuit is an emitter follower circuit with no feedback, a base voltage of the transistor 101 decreases as output power increases. Hence, a base-emitter voltage of the transistor 102 decreases. In this case, the transistor 102 operates so as to supply a high current with the base-emitter voltage being low, thus causing distortion in amplification. On the other hand, in the case of a configuration of a bias circuit of the power amplifier 100, the base-emitter voltage of the transistor 102 is maintained even if output power is high, and the transistor 102 can supply a current with little distortion.

Figure 2:
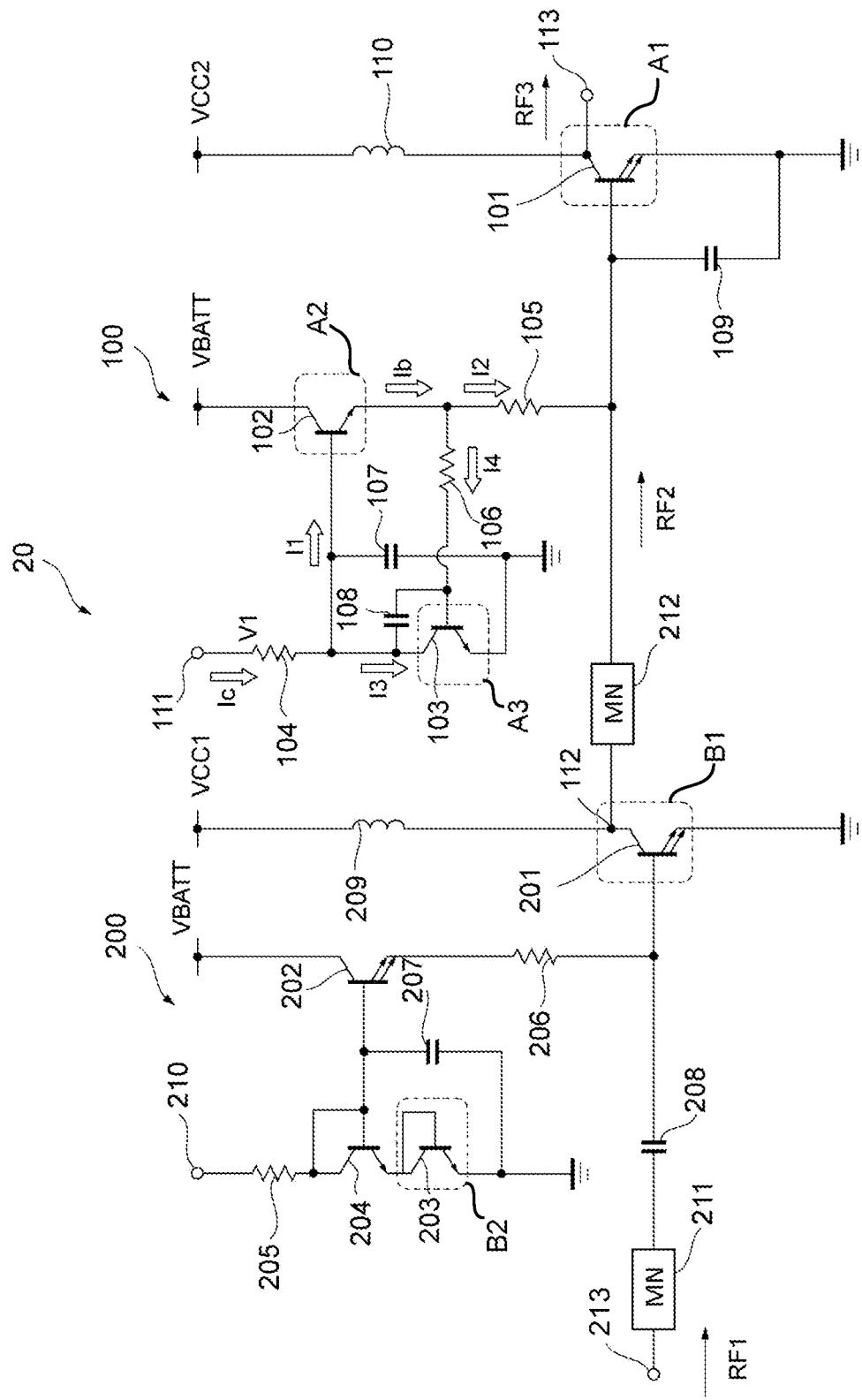
FIG. 2 is a circuit diagram of a power amplifier circuit according to the present embodiment.

FIG. 2 is a circuit diagram of a two-stage power amplifier circuit 20. The power amplifier circuit 20 includes the power amplifier 100 (first power amplifier) as an output-stage (power-stage) amplifier. Assume that a power-supply voltage VCC2 is supplied to the transistor 101 of the power amplifier 100. The power-supply voltage VCC2 does not have to be a constant voltage and may be a variable voltage, such as an envelope tracking (ET) power-supply voltage.

A power amplifier 200 (second power amplifier) functioning as a first-stage (drive-stage) amplifier will be described. The power amplifier 200 includes transistors 201, 202, 203, and 204, resistance elements 205 and 206, capacitors 207 and 208, an inductor 209, an input terminal 210, a matching network 211, and a signal input terminal 213.

As in the transistor 101, the transistor 201 is configured to function as a single transistor including a plurality of unit transistors (fingers) connected and arranged in parallel.

The transistor 201 is provided in a disposition region B1 on the semiconductor substrate (shown in FIG. 3). In the transistor 201, a base is connected to the resistance element 206 and the capacitor 208, the base is connected to the matching network 211, and an emitter is connected to the ground. A power-supply voltage VCC1 is supplied to the collector of the transistor 201 through the inductor 209. The power-supply voltage VCC1 does not have to be a constant voltage and may be a variable voltage, such as an ET power-supply voltage.

The transistor 201 amplifies a signal RF1 (first signal) inputted from the signal input terminal 213 through the matching network 211 and the capacitor 208. The transistor 201 amplifies, in accordance with a bias current outputted by the transistor 202 to be described, the signal RF1 inputted to the base. A signal RF2 (second signal) amplified by the transistor 201 is outputted to the base of the transistor 101 through the matching network 212.

In the transistor 202, a base is connected to the resistance element 205, a collector is connected to the power supply, and an emitter is connected to the resistance element 206. The voltage VBATT is supplied to the collector of the transistor 202. The transistor 202 is switched between on and off states by a current supplied to the base. When the transistor 202 is put into the on state, the transistor 202 outputs a bias current to the base of the transistor 201.

The transistor 203 is a diode-connected transistor. In the transistor 203, a collector is connected to an emitter of the transistor 204, and an emitter is connected to the ground. The transistor 203 is provided in a disposition region B2 on the semiconductor substrate.

The transistor 204 is a diode-connected transistor. In the transistor 204, a collector is connected to the resistance element 205 and the base of the transistor 202, and the emitter is connected to the collector of the transistor 203. A bias circuit is constituted by the transistors 202, 203, and 204.

In the power amplifier circuit 20, the power amplifier 200 amplifies the signal RF1, the transistor 101 amplifies the amplified signal RF2, a signal RF3 (third signal) obtained by amplifying the signal RF2 is outputted from the output terminal 113 of the power amplifier 100.

Referring to FIG. 3, a layout diagram of the power amplifier circuit 20 when a semiconductor substrate 303 is viewed in plan will be described.

The transistors 101, 102, 103, 201, and 203 are formed on the semiconductor substrate 303. The transistor 101 is formed in the disposition region A1 (first disposition region). The transistor 102 is formed in the disposition region A2 (second disposition region). The transistor 103 is formed in a disposition region A3 (third disposition region). The transistor 201 is formed in the disposition region B1. The transistor 203 is formed in the disposition region B2. Incidentally, in FIG. 3, illustrations of wiring and the other circuit elements of the power amplifier circuit 20 are omitted.

On an upper side, that is, on the positive side of the z axis of the transistor 101, a bump 301 (metal member) is provided. On the positive side of the z axis of the transistor 201, a bump 302 is provided. The bump 301 is provided so as to overlay the disposition regions A1, A2, and A3. The bump 302 is provided so as to overlay the disposition regions B1 and B2.

Figure 4:
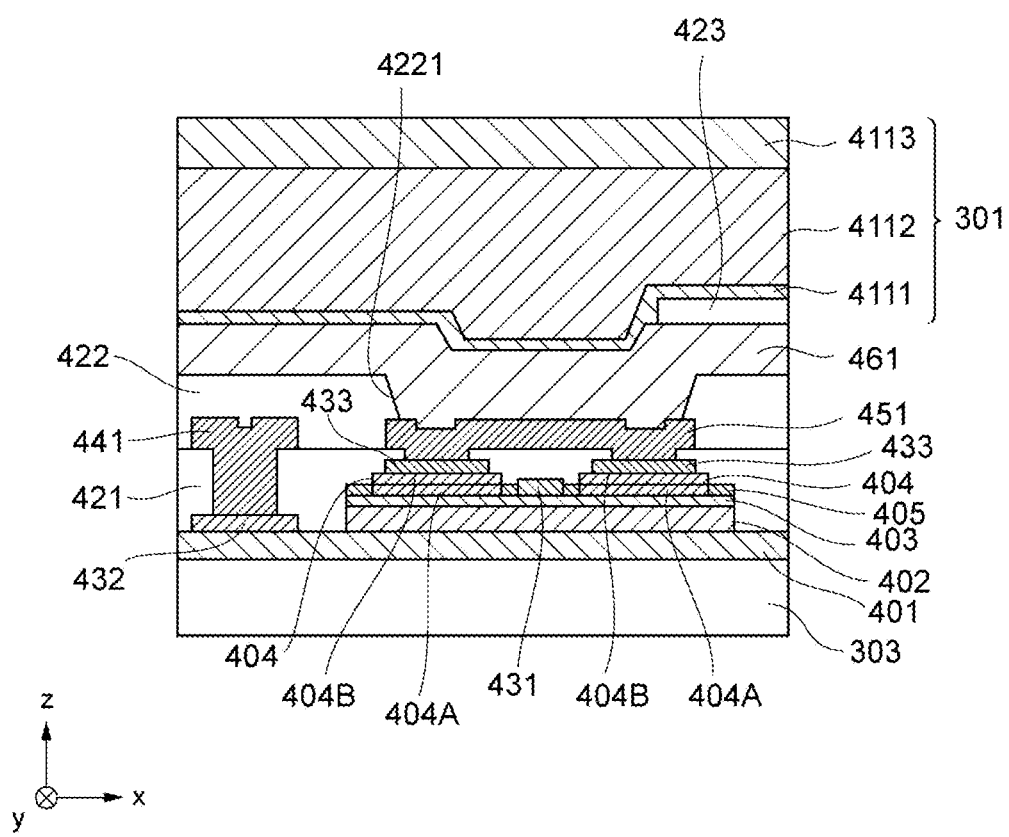
FIG. 4 is a cross-sectional view of the power amplifier in the power amplifier circuit according to the present embodiment.

Referring to FIG. 4, a cross-sectional structure of the transistor 101 will be described. FIG. 4 illustrates a cross-sectional structure of a unit transistor included in the transistor 101. On the semiconductor substrate 303, a sub-collector layer 401 is formed. A material of the semiconductor substrate 303 is, for example, semi-insulating gallium arsenide (GaAs). A material of the sub-collector layer 401 is, for example, a high concentration of n-type GaAs. The thickness of the sub-collector layer 401 is, for example, about 0.5 μm. A collector layer 402 is formed on the sub-collector layer 401. A material of the collector layer 402 is, for example, n-type GaAs. The thickness of the collector layer 402 is, for example, about 1 μm. A base layer 403 is formed on the collector layer 402. A material of the base layer 403 is, for example, p-type GaAs. The thickness of the base layer 403 is, for example, about 100 nm.

An emitter layer 404 is formed on the base layer 403. The emitter layer 404 includes an intrinsic emitter layer 404A and an emitter mesa layer 404B. The intrinsic emitter layer 404A is formed on the base layer 403. The emitter mesa layer 404B is formed on the intrinsic emitter layer 404A. A material of the intrinsic emitter layer 404A is, for example, n-type indium gallium phosphide (InGaP). The thickness of the intrinsic emitter layer 404A is, for example, not less than about 30 nm and not more than about 40 nm. Materials of the emitter mesa layer 404B are, for example, a high concentration of n-type GaAs and a high concentration of n-type InGaP. In the emitter mesa layer 404B, for example, a layer with a thickness of about 100 nm and a high concentration of n-type InGaP is formed on a layer with a thickness of about 100 nm and a high concentration of n-type GaAs.

On an upper surface of the base layer 403, in a region where no emitter layer 404 is formed, a ledge layer 405 is formed. The ledge layer 405 is formed simultaneously with the intrinsic emitter layer 404A and has the same composition as the intrinsic emitter layer 404A. On the ledge layer 405, no emitter mesa layer 404B is formed, and the ledge layer 405 is therefore depleted. Hence, the ledge layer 405 does not function as an emitter of the transistor. Thus, the intrinsic emitter layer 404A and the emitter mesa layer 404B are called the emitter layer 404. The ledge layer 405 is distinguished from the emitter layer 404.

A unit transistor is constituted by the collector layer 402, the base layer 403, and the emitter layer 404.

A base electrode 431 is provided on the base layer 403. The base electrode 431 is in ohmic contact with the base layer 403 through an opening provided in the ledge layer 405. The base electrode 431 is provided between emitter layers 404 of unit transistors.

A collector electrode 432 is provided on the sub-collector layer 401. The collector electrode 432 is in ohmic contact with the sub-collector layer 401. The collector electrode 432 is connected to the collector layer 402 through the sub-collector layer 401.

An emitter electrode 433 is provided on the emitter layer 404. The emitter electrode 433 is in ohmic contact with the emitter layer 404.

The base electrode 431 is formed by stacking, on the base layer 403, for example, a titanium (Ti) film, a platinum (Pt) film, and a gold (Au) film in sequence. The collector electrode 432 is formed by stacking, on the sub-collector layer 401, for example, a gold germanium (AuGe) film, a nickel (Ni) film, and an Au film in sequence. The emitter electrode 433 is formed by a Ti film with a thickness of, for example, about 50 nm.

In a region not illustrated in FIG. 4 of the sub-collector layer 401, an isolation region for providing isolation between elements is provided. The isolation region is formed by isolating part of the sub-collector layer 401, for example, by using an ion implantation technique.

A first insulating film 421 is provided so as to cover a unit transistor. The first insulating film 421 has a stacked structure including, for example, a silicon nitride (SiN) layer and a resin layer. Incidentally, the first insulating film 421 may be formed only by a SiN layer.

A first-layer collector wiring line 441 is provided in or on the first insulating film 421. The first-layer collector wiring line 441 is provided so as to extend through the first insulating film 421 and connect to the collector electrode 432.

A first-layer emitter wiring line 451 is provided in or on the first insulating film 421. The first-layer emitter wiring line 451 is provided for each unit transistor. The first-layer emitter wiring line 451 connects emitter electrodes 433 of respective transistors. Each of the first-layer collector wiring line 441 and the first-layer emitter wiring line 451 has a stacked structure including, for example, a Ti film with a thickness of not less than about 10 nm and not more than about 50 nm and an Au film with a thickness of not less than about 1 μm and not more than about 2 μm.

On the first insulating film 421, a second insulating film 422 is provided so as to cover the first-layer collector wiring line 441 and the first-layer emitter wiring line 451. The second insulating film 422 has a stacked structure including, for example, a SiN layer and a resin layer. Incidentally, the second insulating film 422 may be formed only by a SiN layer.

An emitter wiring line 461 is provided on the second insulating film 422. The emitter wiring line 461 is connected to the first-layer emitter wiring line 451 through a cavity 4221 provided in the second insulating film 422. First-layer emitter wiring lines 451 of the unit transistors arranged in an x-axis direction are connected by the emitter wiring line 461. The emitter wiring line 461 has a stacked structure including, for example, a Ti film with a thickness of not less than about 10 nm and not more than about 50 nm and an Au film with a thickness of not less than about 2 μm and not more than about 4 μm.

On the emitter wiring line 461, a third insulating film 423 is provided so as to cover the emitter wiring line 461. The third insulating film 423 has a stacked structure including, for example, a SiN layer and a resin layer. Incidentally, the third insulating film 423 may be formed only by a SiN film. The third insulating film 423 functions as a protective film that protects the unit transistors.

On the third insulating film 423, the bump 301 is provided. The bump 301 is connected to the emitter wiring line 461 through an opening of the third insulating film 423. The bump 301 has a structure obtained by stacking in this order: an under bump metal layer 4111, a metal post 4112, and a solder layer 4113.

For the under bump metal layer 4111, for example, a Ti film with a thickness of not less than about 50 nm and not more than about 100 nm is used. The under bump metal layer 4111 has a function of increasing adhesion of the bump 301 to the third insulating film 423.

For the metal post 4112, for example, a copper (Cu) film with a thickness of not less than about 30 μm and not more than about 50 μm is used. For the solder layer 4113, for example, a tin (Sn) or tin-silver (SnAg) alloy film with a thickness of not less than about 10 μm and not more than about 30 μm is used.

Incidentally, a barrier metal layer composed of Ni and so forth against interdiffusion may be disposed between the metal post 4112 and the solder layer 4113.

Figure 5:
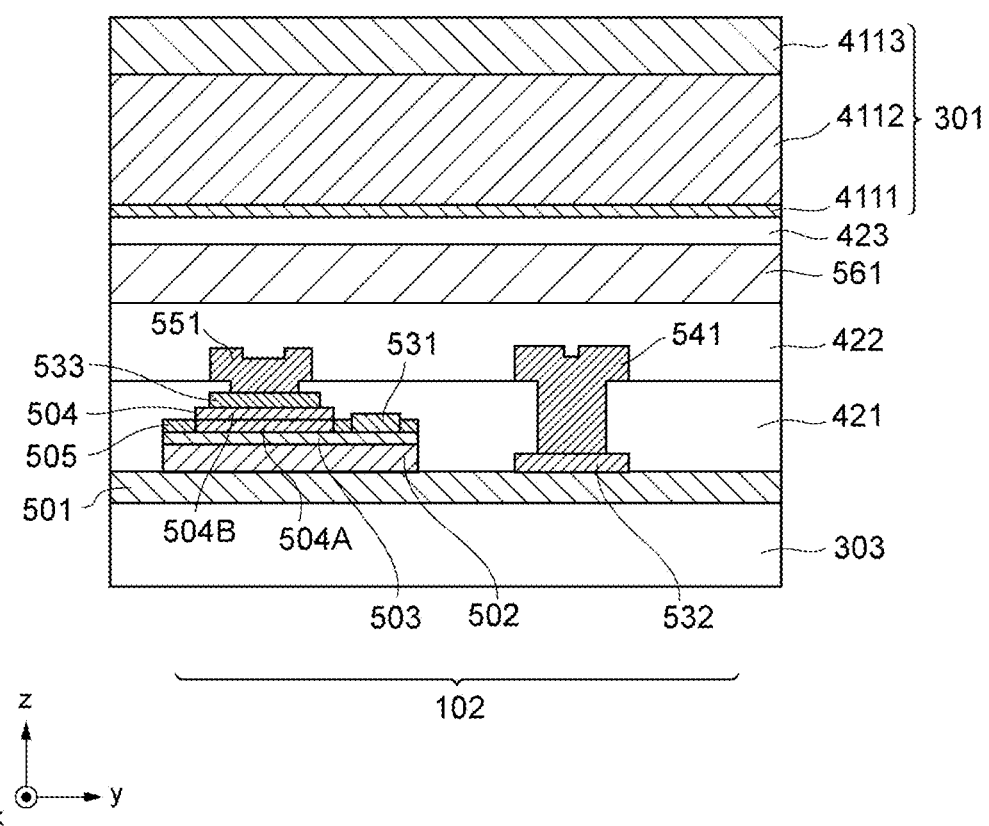
FIG. 5 is a cross-sectional view of the power amplifier in the power amplifier circuit according to the present embodiment.

Referring to FIG. 5, a cross-sectional structure of the transistor 102 will be described. FIG. 5 is a cross-sectional view of the transistor 102 in a y-z plane. On the semiconductor substrate 303, a sub-collector layer 501 is formed. A collector layer 502 is formed on the sub-collector layer 501. A base layer 503 is formed on the collector layer 502. An emitter layer 504 and a ledge layer 505 are formed on the base layer 503. The emitter layer 504 includes an intrinsic emitter layer 504A and an emitter mesa layer 504B. Relationships among the intrinsic emitter layer 504A, the emitter mesa layer 504B, and the ledge layer 505 are similar to relationships among the intrinsic emitter layer 404A, the emitter mesa layer 404B, and the ledge layer 405.

The transistor 102 is constituted by the collector layer 502, the base layer 503, and the emitter layer 504.

The transistor 102 is formed by a process that is the same as that by which the transistor 101 is formed. Hence, characteristics of the transistor 102 are varied by stress in a manner similar to those of a unit transistor of the transistor 101.

A base electrode 531 is provided on the base layer 503. The base electrode 531 is in ohmic contact with the base layer 503 through an opening provided in the ledge layer 505. A collector electrode 532 is provided on the sub-collector layer 501. The collector electrode 532 is in ohmic contact with the sub-collector layer 501. The collector electrode 532 is connected to the collector layer 502 through the sub-collector layer 501. An emitter electrode 533 is provided on the emitter layer 504. The emitter electrode 533 is in ohmic contact with the emitter layer 504.

The base electrode 531, the collector electrode 532, and the emitter electrode 533 are formed by respective processes that are the same as those by which the base electrode 431, the collector electrode 432, and the emitter electrode 433 are formed.

A first insulating film 421 is provided so as to cover the transistor 102. The first insulating film 421 has a stacked structure including, for example, a SiN layer and a resin layer. Incidentally, the first insulating film 421 may be formed only by a SiN layer.

A first-layer collector wiring line 541 is provided in or on the first insulating film 421. The first-layer collector wiring line 541 is provided so as to extend through the first insulating film 421 and connect to the collector electrode 532.

A first-layer emitter wiring line 551 is provided in or on the first insulating film 421.

On the first insulating film 421, a second insulating film 422 is provided so as to cover the first-layer collector wiring line 541 and the first-layer emitter wiring line 551. The second insulating film 422 has a stacked structure including, for example, a SiN layer and a resin layer. Incidentally, the second insulating film 422 may be formed only by a SiN layer.

A metal layer 561 is provided on the second insulating film 422.

Materials and structures of the collector wiring line 541, the first-layer emitter wiring line 551, and the metal layer 561 are similar to those of the collector wiring line 441, the first-layer emitter wiring line 451, and the emitter wiring line 461.

On the metal layer 561, a third insulating film 423 is provided so as to cover the metal layer 561. The third insulating film 423 has a stacked structure including, for example, a SiN layer and a resin layer. Incidentally, the third insulating film 423 may be formed only by a SiN film. The third insulating film 423 functions as a protective film that protects the transistor 102.

In the power amplifier circuit 20, the first insulating film 421 of the transistor 101 and the first insulating film 421 of the transistor 102, the second insulating film 422 of the transistor 101 and the second insulating film 422 of the transistor 102, and the third insulating film 423 of the transistor 101 and the third insulating film 423 of the transistor 102 are formed by the same respective processes.

In the power amplifier circuit 20, although the emitter wiring line 461 and the metal layer 561 are formed by the same process, the emitter wiring line 461 and the metal layer 561 are provided separately. The emitter wiring line 461 and the metal layer 561 may be formed to be integrated without separating from each other. In other words, the metal layer 561 may be formed as part of the emitter wiring line 461 such that the emitter wiring line 461 is extended to above the transistor 102.

Furthermore, a cross-sectional structure of the transistor 103 is similar to that of the transistor 102. A cross-sectional structure of the transistor 201 is similar to that of the transistor 101. A cross-sectional structure of the transistor 203 is similar to that of the transistor 102.

Operation of the power amplifier circuit 20 will be described with reference to FIGS. 6, 7, and 8. Changes in current due to stress will be described. Here, a description will be given assuming that the current Ic is a constant-value direct current. In the power amplifier 100, when stress is applied only to the transistor 101 from the bump 301, an operating point of the transistor 101 shifts, and an idle current in the transistor 101 thereby decreases.

Figure 6:
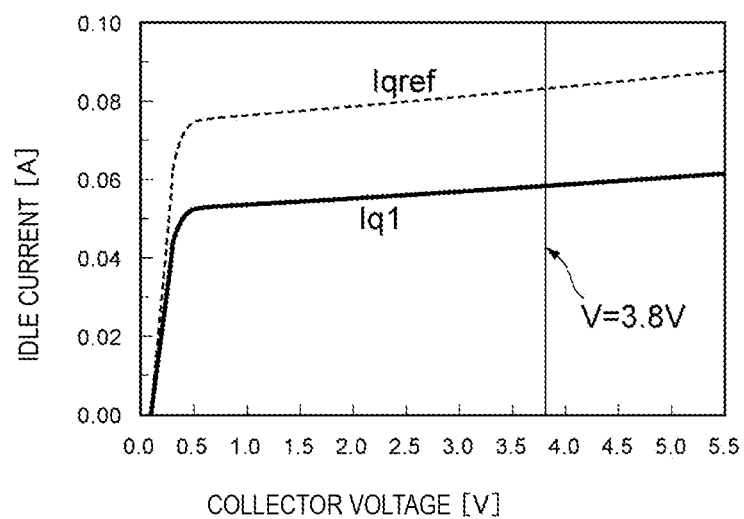
FIG. 6 illustrates idle currents in the power amplifier circuit according to the present embodiment.

FIG. 6 illustrates simulation results of idle currents in the power amplifier 100 in the power amplifier circuit 20. The horizontal axis represents collector voltage of the transistor 101. In FIG. 6, Iq1 denotes an idle current in the transistor 101 exhibited when stress is applied only to the transistor 101 from the bump 301. In FIG. 6, Iqref denotes an idle current exhibited when stress from the bump 301 is not applied to the power amplifier 100. Variations in idle current due to stress are indicated by a difference between Iq1 and Iqref.

Next, the operation when stress is also applied to the transistor 102 and the transistor 103 by the bump 301 will be described. Changes in current exhibited when stress is applied to each of the transistors 101, 102, and 103 will be described considering influences in the individual transistors.

When stress is applied to the transistor 101, a collector current of the transistor 101 decreases. A base current of the transistor 101, that is, the current I2 decreases due to a decrease in the collector current. When the current I2 decreases, the current I1 decreases. When the current I1 decreases, the current I3 increases. When the current I1 decreases, the current I4 increases.

Figure 7:
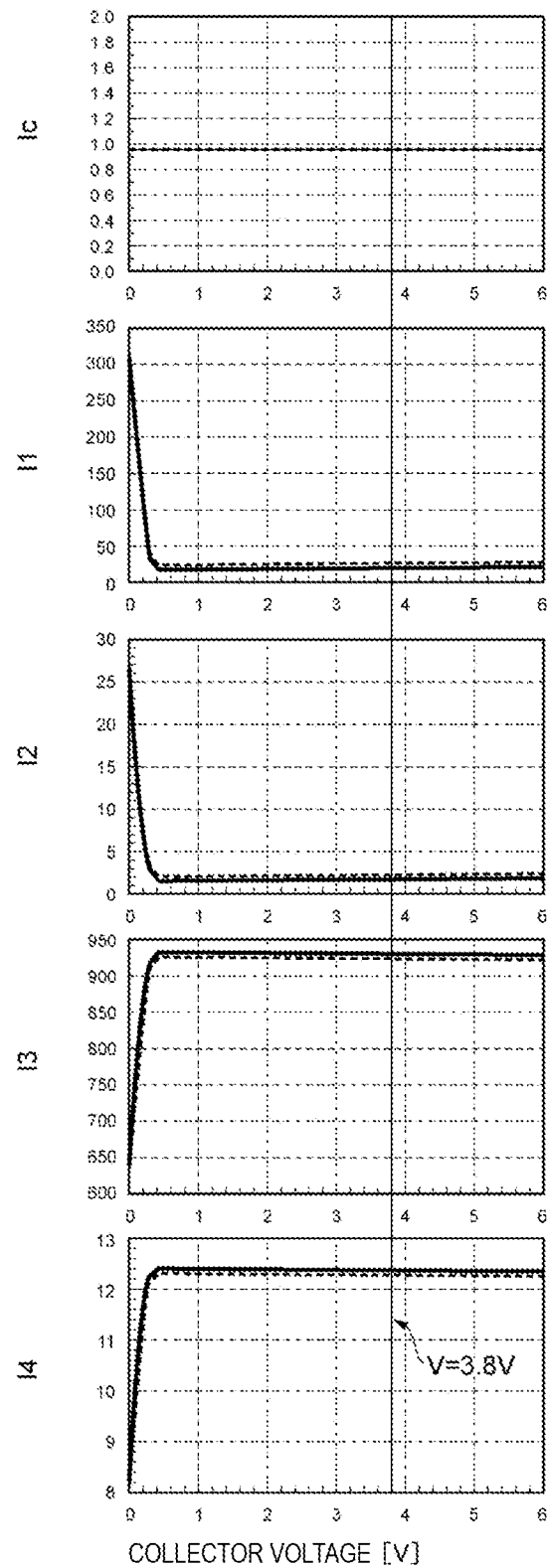
FIG. 7 illustrates characteristics of the power amplifier circuit according to the present embodiment.

FIG. 7 illustrates changes in the currents Ic, and I1 to I4 exhibited when stress is applied only to the transistor 101 of the power amplifier 100 of the power amplifier circuit 20. The horizontal axis represents collector voltage of the transistor 101. A current exhibited when stress is not applied from the bump 301 is indicated by a dashed line, and a current exhibited when stress is applied from the bump 301 is indicated by a solid line. In FIG. 7, when the voltage is, for example, 3.8 V, a decrease in the current I1, a decrease in the current I2, an increase in the current I3, and an increase in the current I4 are illustrated.

When stress is applied to the transistor 102, a collector current of the transistor 102 decreases. A base current of the transistor 102, that is, the current I1 decreases due to a decrease in the collector current. When the current I1 decreases, the current I2 decreases. When the current I1 decreases, the current I3 increases. When the current I1 decreases, the current I4 increases.

When stress is applied to the transistor 103, a collector current of the transistor 103, that is, the current I3 decreases. When the current I3 decreases, the current I1 increases. When the current I1 increases, the current I2 increases. When the current I1 increases, the current I4 decreases.

When stress is applied to the transistor 101 and the transistor 102, the transistor 101 and the transistor 102 cause the currents I2, I3, and I4 to vary in the same respective manners. When stress is applied to the transistor 101, an idle current in the transistor 101 tends to decrease due to a decrease in the current I1. When stress is applied to the transistor 102, an idle current in the transistor 101 tends to decrease due to a decrease in the current I2.

On the other hand, the transistor 103 causes the currents I2, I3, and I4 to vary in respective manners opposite to the manners of variations exhibited when stress is applied to the transistors 101 and 102. When stress is applied to the transistor 103, the current I2 increases, and an idle current in the transistor 101 therefore tends to increase.

In other words, when stress is applied, decreases in idle current caused by the transistors 101 and 102 whose characteristics shift in a similar manner are cancelled out by an increase in idle current caused by the transistor 103.

Figure 8:
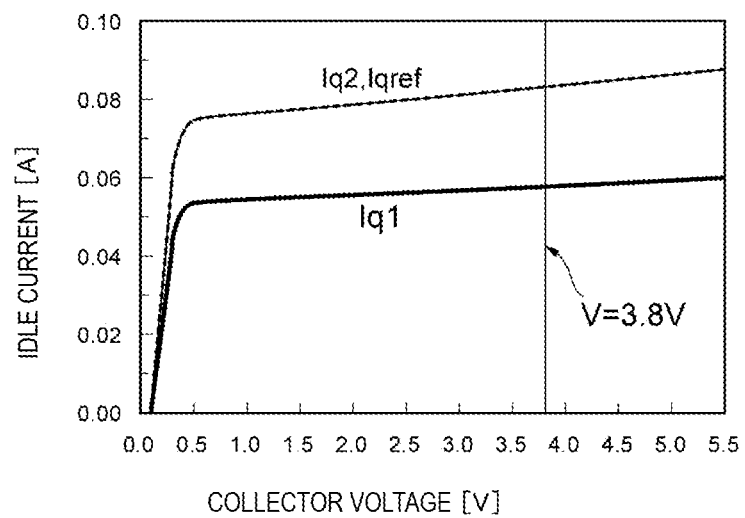
FIG. 8 illustrates idle currents in the power amplifier circuit according to the present embodiment.

FIG. 8 illustrates simulation results of idle currents in the power amplifier 100 in the power amplifier circuit 20. The horizontal axis represents collector voltage of the transistor 101. In FIG. 8, in addition to Iq1 and Iqref illustrated in FIG. 6, an idle current Iq2 exhibited when stress is applied to the transistors 101, 102, and 103 from the bump 301 is indicated by a solid line. In FIG. 8, Iq2 considerably coincides with Iqref.

In FIG. 8, when the voltage is 3.8 V, Iq1 is 57.8 mA, and Iqref and Iq2 are 83.4 mA. FIG. 8 indicates that, when stress equivalent to stress applied to the transistor 101 is applied to the transistors 102 and 103 from the common bump 301, variations in idle current are reduced.

Incidentally, if no stress is applied to the transistor 102, an increase in the current I2 caused by application of stress to the transistor 103 exceeds a decrease in the current I2 caused by the transistor 101. Hence, an idle current varies so as to be higher than Iqref exhibited when there is no influence of stress from the bump 301.

Figure 9:
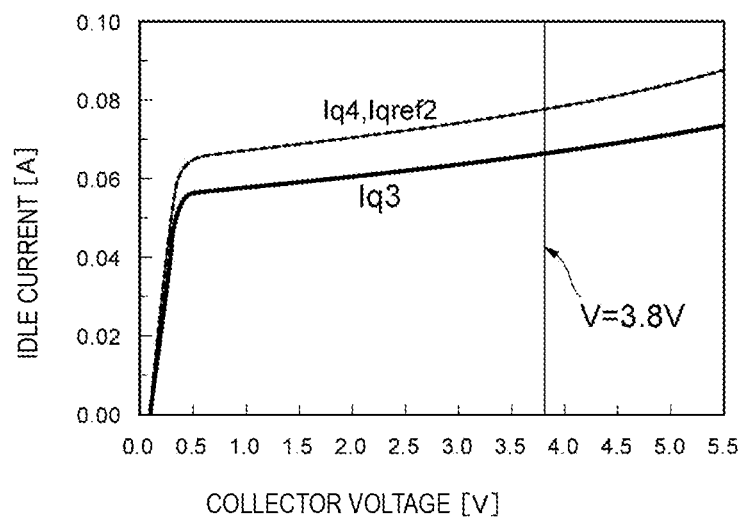
FIG. 9 illustrates idle currents in the power amplifier circuit according to the present embodiment.

FIG. 9 illustrates simulation results of idle currents in the power amplifier 200 in the power amplifier circuit 20. In FIG. 9, Iq3 denotes an idle current exhibited when stress is applied only to the transistor 201 from the bump 302. In FIG. 9, Iqref2 indicated by a dashed line denotes an idle current exhibited when stress from the bump 302 is not applied to the power amplifier 200. Variations in idle current due to stress are indicated by a difference between Iq3 and Iqref2. When stress is applied to the transistor 203 from the bump 302, variations in idle current are reduced as indicated by a solid line of Iq4 in FIG. 9. In FIG. 9, Iq4 considerably coincides with Iqref2. In FIG. 9, when the voltage is 3.8 V, Iq3 is 66.7 mA, and Iqref2 and Iq4 are 78.3 mA.

Figure 10:
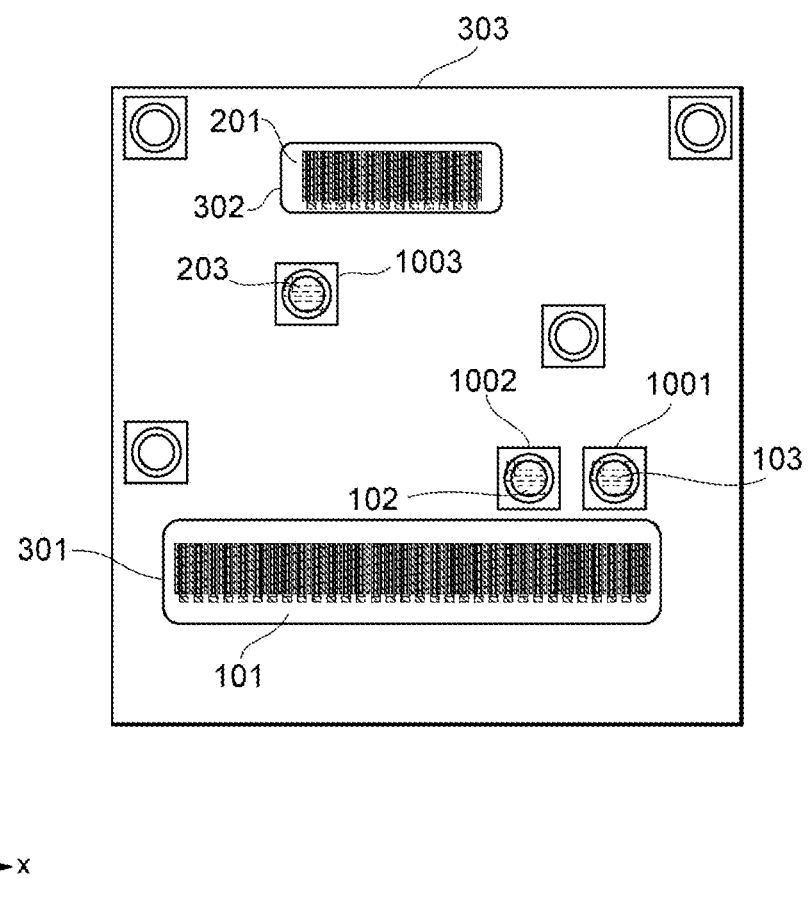
FIG. 10 is another schematic layout diagram of the power amplifier circuit according to the present embodiment.

FIG. 10 illustrates an example of another layout of the power amplifier circuit 20 according to the present embodiment. In FIG. 10, a bump 1001 is provided on the positive side of the z axis of the transistor 103. A bump 1002 is provided on the positive side of the z axis of the transistor 102. A bump 1003 is provided on the positive side of the z axis of the transistor 203.

In a configuration illustrated in FIG. 10, the bumps 1001 and 1002 are in close proximity to the bump 301, and thus the stress substantially equivalent to the stress applied to the transistor 101 is applied to the transistors 102 and 103. Hence, variations in idle current can be reduced. Similarly, the stress substantially equivalent to the stress applied to the transistor 201 is applied to the transistor 203 by the bump 1003. Here, "equivalent stress" includes an error of plus or minus 20.

Bumps provided for the transistors 101, 102, and 103 may be integrated or separated as long as the bumps can apply stress equivalent to stress causing a change in the operating point of the transistor 101. For example, a common bump may be provided for the transistors 101 and 102, and another bump may be provided for the transistor 103. Alternatively, a common bump may be provided for the transistors 102 and 103 and may be separated from a bump of the transistor 101. Incidentally, it is more desirable that a bump or bumps provided for the transistors 102 and 103 be close to or integrated into a bump provided for the transistor 101.

Figure 11:
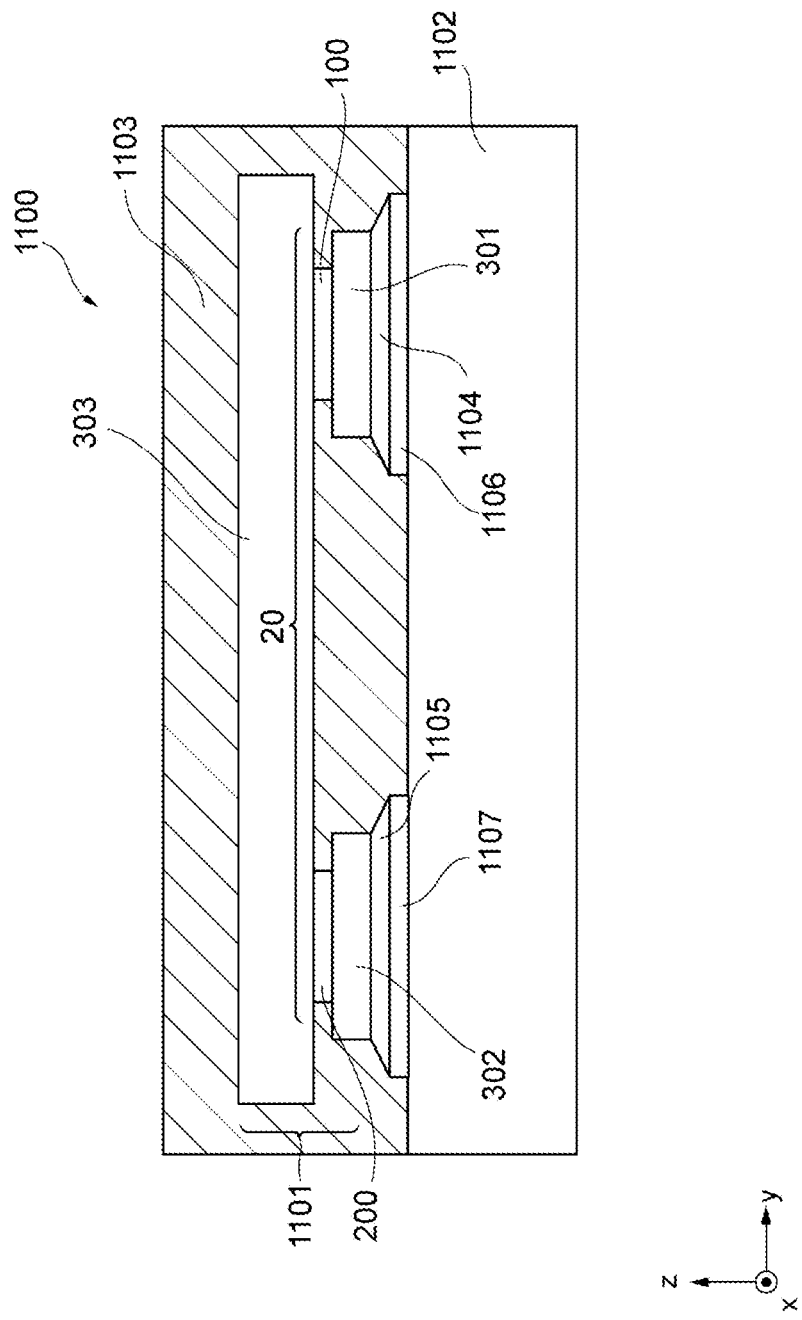
FIG. 11 is a cross-sectional view of a power amplifier device according to the present embodiment.

FIG. 11 is a cross-sectional view of a power amplifier device 1100 including the power amplifier circuit 20. The cross-sectional view of FIG. 11 is a cross-sectional view taken along the y-z plane in FIG. 3. The power amplifier device 1100 includes a semiconductor chip 1101, a module substrate 1102, and a resin mold 1103.

In the semiconductor chip 1101, the power amplifier circuit 20 is provided. The transistors 101, 102, and 103 are connected to the module substrate 1102 through the bump 301. The transistors 201 and 203 are connected to the module substrate 1102 through the bump 302. A solder 1104 and a solder 1105 are connected to the bump 301 and the bump 302, respectively.

The module substrate 1102 includes a substrate electrode 1106 (junction) and a substrate electrode 1107 (junction). The substrate electrode 1106 and the substrate electrode 1107 are respectively connected to the solder 1104 and the solder 1105.

The resin mold 1103 is provided on the module substrate 1102 so as to cover the semiconductor chip 1101, the solders 1104 and 1105, and the substrate electrodes 1106 and 1107.

Thermal stress in the power amplifier device 1100 will be described. In the power amplifier device 1100, the bumps 301 and 302 differ from the resin mold 1103 in thermal expansion coefficient. The thermal expansion coefficient of the bumps 301 and 302 is larger than that of the resin mold 1103.

For example, when heat is applied from outside through a reflow test or the like and the external temperature of the power amplifier device 1100 rises, the bumps 301 and 302 and the resin mold 1103 thermally expand. Since the bump 301 has a large thermal expansion coefficient, a change in the dimension of the bump 301 with respect to a change in temperature is larger than that of the resin mold 1103. At this time, the bump 301 is surrounded by the resin mold 1103, and thus the thermal expansion of the bump 301 is restrained by the resin mold 1103. The bump 301 whose displacement is restrained applies stress not only to the resin mold 1103, but also to the power amplifier 100 and the solder 1104 that are in contact with the bump 301.

As a result, for example, in the power amplifier 100, even after the heat is removed, the stress caused by the thermal stress remains, and a base-emitter voltage of each transistor varies due to the stress.

In the power amplifier device 1100, the bump 302 is provided. When the bump 302 thermally expands, the bump 302 applies thermal stress to the power amplifier 200 as in the bump 301. Hence, in the power amplifier 200 as well, base-emitter voltages of the transistors 201 and 203 vary due to the stress caused by the thermal stress.

In the power amplifier device 1100, variations in idle current due to the stress can be reduced by the power amplifier 100 and the power amplifier 200. Hence, the power can be amplified while reducing variations in idle current.

Incidentally, in the power amplifier circuit 20, members that apply the stress to the power amplifier 100 and the power amplifier 200 are not limited to the bumps 301 and 302. Any metal members may be used that are provided so as to, when the power amplifier circuit 20 is mounted, apply stress to each transistor of the power amplifier 100 and the power amplifier 200 due to a difference between the thermal expansion coefficients of the metal members and the resin mold 1103.

The exemplary embodiment of the present disclosure has been described above. The power amplifier 100 includes the transistor 101 that is formed on the semiconductor substrate 303; the transistor 102 that is formed on the semiconductor substrate 303, that includes a base to which the current I1 which is part of the current Ic is supplied, and that is configured to supply the current I2 which is part of the current Ib based on the current I1 to the transistor 101; the transistor 103 that is formed on the semiconductor substrate 303, to which the current I3 which is part of the current Ic and the current I4 which is part of the current Ib are supplied, and in which the current I3 decreases as the applied stress increases; and the bump 301 that is electrically connected to an emitter of the transistor 101 and that is provided so as to, when the semiconductor substrate 303 is viewed in plan, overlay the disposition region A1 where the transistor 101 is disposed, the disposition region A2 where the transistor 102 is disposed, and the disposition region A3 where the transistor 103 is disposed.

The stress applied to the transistor 101 from the bump 301 can also be applied to the transistors 102 and 103. Hence, variations in idle current in the transistor 101 can be reduced.

Furthermore, the power amplifier circuit 20 includes the power amplifier 100; and the power amplifier 200 configured to receive the input of the signal RF1 and output, to the transistor 101 of the power amplifier 100, the signal RF2 obtained by amplifying the signal RF1. The power amplifier 100 outputs the signal RF3 obtained by amplifying the signal RF2.

In the multi-stage power amplifier circuit, the power amplifier 100 is used as a subsequent-stage amplifier whose output is larger. Thus, in the case where a decrease in idle current further increases, variations in idle current can be reduced.

Furthermore, the power amplifier device 1100 includes the semiconductor chip 1101 including the power amplifier 100; and the module substrate 1102 where the semiconductor chip 1101 is mounted. The module substrate 1102 includes the substrate electrodes 1106 and 1107 joined to the bumps 301 and 302 of the semiconductor chip 1101. The power amplifier device 1100 includes the power amplifier 100 and thus can amplify the power while reducing variations in idle current due to the stress.

The above-described embodiment is intended to facilitate understanding of the present disclosure but is not intended for a limited interpretation of the present disclosure. The present disclosure can be changed or improved without departing from the gist thereof and also encompasses equivalents thereof. In other words, appropriate design changes made to the embodiment by those skilled in the art are also encompassed in the scope of the present disclosure as long as the changes have features of the present disclosure. For example, the elements included in the embodiment, and the arrangement, materials, conditions, shapes, sizes, and so forth of the elements are not limited to those exemplified herein and can be appropriately changed. Furthermore, the embodiment is illustrative, and it goes without saying that configurations in different embodiments can be partially replaced or combined. Such replacement and combination are also encompassed in the scope of the present disclosure as long as they have features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier comprising:
   a first transistor on a semiconductor substrate;
   a second transistor on the semiconductor substrate, the second transistor having a base to which a first current which is part of a control current is supplied, and being configured to supply a second current which is part of a bias current based on the first current to the first transistor;
   a third transistor on the semiconductor substrate, to which a third current which is part of the control current and a fourth current which is part of the bias current are supplied, and in which the third current decreases as applied stress increases; and
   a metal member that is electrically connected to an emitter of the first transistor and that, when the semiconductor substrate is viewed in plan, overlays a first disposition region where the first transistor is disposed, a second disposition region where the second transistor is disposed, and a third disposition region where the third transistor is disposed.

2. The power amplifier according to claim 1, wherein the first disposition region, the second disposition region, and the third disposition region are part of the semiconductor substrate.

3. The power amplifier according to claim 1, wherein the first transistor is a multi-finger transistor comprising a plurality of unit transistors connected in parallel.

4. The power amplifier according to claim 3, wherein the plurality of unit transistors are heterojunction bipolar transistors (HBT).

5. The power amplifier according to claim 1, wherein the second transistor is a multi-finger transistor comprising a plurality of unit transistors connected in parallel.

6. The power amplifier according to claim 1, wherein a base of the first transistor is connected to an emitter of the second transistor through a first resistor.

7. The power amplifier according to claim 6, wherein the base of the first transistor is connected to ground through a first capacitor.

8. The power amplifier according to claim 6, wherein a collector of the second transistor is connected to a power-supply and an emitter of the second transistor is connected to the first resistor and to a third resistor.

9. The power amplifier according to claim 8, wherein a base of the third transistor is connected to the third resistor.

10. The power amplifier according to claim 1, wherein a power-supply voltage is supplied to a collector of the first transistor through an inductor.

11. The power amplifier according to claim 1, wherein an emitter of the first transistor is connected to ground.

12. The power amplifier according to claim 1, wherein the base of the second transistor is connected to ground through a second capacitor.

13. The power amplifier according to claim 1, wherein the base of the second transistor is connected to a second resistor.

14. The power amplifier according to claim 13, wherein a collector of the third transistor is connected to the second resistor.

15. The power amplifier according to claim 11, wherein an emitter of the third transistor is connected to ground.

16. The power amplifier according to claim 11, wherein a collector of the third transistor is connected to a base of the third transistor through a third capacitor.

17. A power amplifier circuit comprising:
a first power amplifier that is the power amplifier according to claim 1; and
a second power amplifier configured to receive input of a first signal and output, to the first transistor of the first power amplifier, a second signal obtained by amplifying the first signal,
wherein the first power amplifier outputs a third signal obtained by amplifying the second signal.

18. The power amplifier circuit according to claim 17, wherein the first transistor and the second transistor are multi-finger transistors comprising a plurality of unit transistors connected in parallel.

19. A power amplifier device comprising:
a semiconductor chip including the power amplifier according to claim 1; and
a module substrate where the semiconductor chip is mounted,
wherein the module substrate includes a junction joined to the metal member of the semiconductor chip.

20. The power amplifier device according to claim 19, wherein the first transistor, the second transistor, and the third transistor are connected to the module substrate through the metal member.

* * * * *